United States Patent
Nakajima

(10) Patent No.: US 7,382,511 B2
(45) Date of Patent: Jun. 3, 2008

(54) LIGHT MODULATION TYPE PHOTOINTERRUPTER

(75) Inventor: Akio Nakajima, Katsuragi (JP)

(73) Assignee: Sharp Kabushiki Kaisha, Osaka (JP)

(*) Notice: Subject to any disclaimer, the term of this patent is extended or adjusted under 35 U.S.C. 154(b) by 196 days.

(21) Appl. No.: 11/295,508

(22) Filed: Dec. 7, 2005

(65) Prior Publication Data
US 2006/0118695 A1    Jun. 8, 2006

(30) Foreign Application Priority Data
Dec. 8, 2004    (JP) .............................. 2004-356049

(51) Int. Cl.
    *G02F 1/03*    (2006.01)
(52) U.S. Cl. ................................... 359/264
(58) Field of Classification Search ................ 250/214, 250/574, 336.1, 222, 222.1; 356/4.1, 5.1; 340/556; 359/264
See application file for complete search history.

(56) References Cited

U.S. PATENT DOCUMENTS

| | | | | |
|---|---|---|---|---|
| 5,099,113 A | * | 3/1992 | Oi et al. .................. | 250/214 B |
| 5,243,182 A | * | 9/1993 | Murata et al. ............ | 250/222.1 |
| 6,982,408 B2 | * | 1/2006 | Maruyama ................. | 250/221 |

FOREIGN PATENT DOCUMENTS

| | | |
|---|---|---|
| JP | 61-265878 A | 11/1986 |
| JP | 61-265879 A | 11/1986 |
| JP | 7-14394 U | 3/1995 |
| JP | 7-55953 A | 3/1995 |
| JP | 7-225282 A | 8/1995 |
| JP | 9-307136 A | 11/1997 |
| JP | 2001-221859 A | 8/2001 |
| JP | 2003-240637 A | 8/2003 |

* cited by examiner

*Primary Examiner*—Ricky L Mack
*Assistant Examiner*—Tuyen Q Tra
(74) *Attorney, Agent, or Firm*—Birch, Stewart, Kolasch & Birch, LLP

(57) ABSTRACT

A light modulation type photointerrupter includes: a light source that emits a light pulse to a transit area where an object transits; a driving circuit that drives the light source to emit the light pulse; a photoreceptor that converts the light pulse from the transit area into a pulse current and outputs the pulse current; an integrating circuit that integrates a pulse signal resulting from the pulse current and outputs a result of the integration, the integrating circuit having different time constants at a rise and at a fall of the pulse signal; and a detecting circuit that detects, based upon the output from the integrating circuit, presence or absence of the object in the transit area. The light source is driven to emit a pulse, which reduces the loss of power in the light emitter and the consumption of the current.

10 Claims, 4 Drawing Sheets

LIGHT MODULATION TYPE PHOTOINTERRUPTER

This Nonprovisional application claims priority under 35 U.S.C. § 119(a) on Patent Application No. 356049/2004 filed in Japan on Dec. 8, 2004, the entire contents of which are hereby incorporated by reference.

FIELD OF THE INVENTION

The present invention relates to a light modulation type photointerrupter that can detect an object by using light.

BACKGROUND OF THE INVENTION

Conventional electronics devices including FA (Factory Automation) apparatuses such as a copying machine or a printer, OA (Office Automation) apparatuses, and amusement apparatuses are often required to detect various objects (recording papers, coins, balls etc.) transiting through a path inside the electronic devices. A photointerrupter that is a light detecting device, a device using light for detecting an object, is preferably used for such detection because of its capability of detecting substances without physical contact.

FIG. 3 illustrates a conventional photointerrupter (first conventional photointerrupter), which includes a light emitter 32 for emitting light, and a photoreceptor 33a for detecting the light. With this structure, presence or absence of substance is determined based upon whether the light across the light emitter 32 and the photoreceptor 33a is blocked. Usually, a light emitting diode that emits infrared light or visible light is adopted as the light emitter 32.

To detect light from the light emitter 32, the photointerrupter of this example includes: the photoreceptor 33a that is a photodiode for receiving light from the light emitter 32 and converting the light into current; an I-V converting circuit 33b that converts the current into voltage; a hysteresis-type comparator circuit 35 that compares the voltage with a reference voltage; and an output circuit 36 that externally outputs the voltage in appropriate condition. The reference voltage is generated by a constant voltage circuit 38 driven by a source voltage Vcc.

There are two types of photointerrupters: a transmission type photointerrupter and a reflection type photointerrupter. In the transmission type photointerrupter, when no object exists in an optical path across the light emitter and the photoreceptor, light from the light emitter is sensed by the photoreceptor. On the other hand, when an object exists in the optical path, the light from the light emitter is blocked. In the reflection type photointerrupter, it is the other way round.

As illustrated in FIG. 3, in the conventional photointerrupter, when the light emitter 32 emits light, that is, when the source voltage Vcc is supplied, a current IF is kept running through the light emitting diode. Then, it is determined whether an object transits the optical path across the light emitter and the photoreceptor.

Normally, the current IF in the light emitting diode functioning as the light emitter is approximately 10 mA to 20 mA. A current in the photodiode functioning as the photoreceptor is approximately one tenth of the light emitting diode. The power loss P of the entire photointerrupter is expressed as the formula (1) below:

$$P = ((Vcc - VF)/R1) \times Vcc + Vcc \times Icc \quad (1).$$

In the formula (1), R1 represents a resistance of a current-limiting resistor for the light emitting diode, Vcc represents a source voltage, VF represents a forward voltage of the light emitting diode and Icc represents a current consumed by the photoreceptor (including an oscillation drive circuit).

For example, assumed that Vcc=5V, IF=20 mA, and ICC=2 mA, the power loss P1 in the light emitter is calculated as P1=5V×20 mA=100 mW, and the power loss P2 in the photoreceptor is calculated as P2=5V×2 mA=10 mW. It is apparent therefrom that the power loss in the light emitter is considerably higher than that of the photoreceptor.

FIG. 4 illustrates a circuit of a light-modulation type photointerrupter (second conventional photointerrupter). This photointerrupter detects an object in the way described below. In the light modulation type photointerrupter, the light emitter 32 emits a light pulse that corresponds to a pulse signal from an oscillation drive circuit 39, so as to prevent an error operation caused by disturbance light, such as DC light. Then, the photoreceptor 33a senses a light pulse and converts the light pulse into current, the current is converted into voltage, and the voltage is filtered by a BPF (band pass-filter) 40. Consequently, only a signal that passed through the BPF 40 is integrated by a waveform shaping circuit 41 and then is processed by the hysteresis-type comparator circuit 35. (see, for example, Japanese Unexamined Patent Application No. 225282/1995 (Tokukaihei 7-225282, published on Aug. 22, 1995)).

The circuit structure disclosed in the above publication (JP 225282/1995) can reduce a loss in the light emitter. However, because the circuit structure uses plural different logics, the size of the circuit is expanded, resulting in an increase of cost.

SUMMARY OF THE INVENTION

In order to solve the above problems, a photointerrupter of the present invention is characterized in that the light modulation type photointerrupter includes: a light source that emits a light pulse to a transit area where an object transits; a driving circuit that drives the light source to emit the light pulse; a photoreceptor that converts the light pulse from the transit area into a pulse current and outputs the pulse current; an integrating circuit that integrates a pulse signal resulting from the pulse current and outputs a result of the integration, the integrating circuit having different time constants at a rise and at a fall of the pulse signal; and a detecting circuit that detects, based upon the output from the integrating circuit, presence or absence of the object in the transit area.

In the above structure, the light emitter is driven to emit a light pulse, the light pulse is received by the photoreceptor, and the photoreceptor outputs a pulse current. Then a pulse signal generated from the pulse current is transmitted to a simply-structured integrating circuit having different time constants at a rise and at a fall of the pulse signal. With this structure, transit of an object can be detected by a detecting circuit.

In the above structure, the light source is driven to emit a pulse. This reduces the loss of power in the light emitter and the consumption of the current. Moreover, the object can be detected by using a simply structured integrating circuit. Therefore, cost can be reduced.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
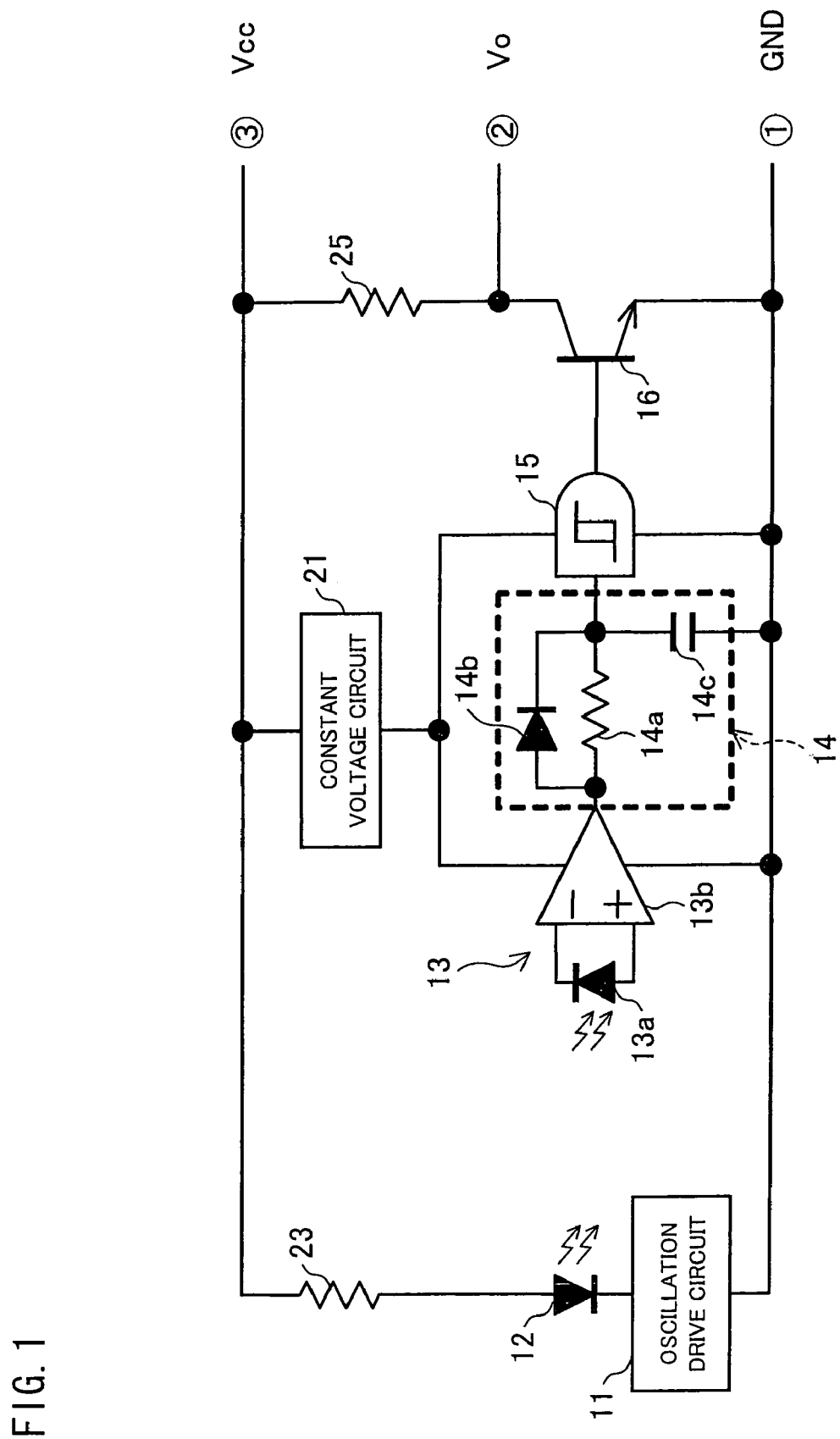
FIG. 1 is a block diagram illustrating a structure of a substantial part of a photointerrupter of an embodiment of the present invention.

As illustrated in the block diagram of the circuit in FIG. 1, a photointerrupter of an embodiment of the present invention includes a light emitter (light source) 12, a light sensing section 13, an integrating circuit 14, a comparator 15, and an output circuit 16.

The light emitter 12 may emit infrared light, visible light, or ultraviolet light. In the embodiment, the light emitter 12 emits infrared light, and a gallium arsenide diode emitting infrared light is adopted. A limiting resistor 23 is serially connected to the light emitter 12. Further, an oscillation drive circuit 11 is serially connected to the light emitter 12 so that the light emitter 12 emits a light pulse. In the oscillation drive circuit 11, a pulse signal for the light emitter 12 to emit the light pulse is created. Further, in the oscillation drive circuit 11, it is preferable that the light emitter 12 be driven with a constant current.

As the light sensing section 13, a photodiode or phototransistor having a spectral sensitivity characteristic corresponding to an emission spectrum of the light emitter 12 can be used. Specifically, it is preferable that, in the emission spectrum of the light emitter 12, a peak of the spectral sensitivity exists either at a maximum wavelength where the intensity of emitting light is increased or in the neighborhood of the maximum wavelength. In the photodiode (photoreceptor) 13a according to the present embodiment, a current outputted from the photodiode linearly changes in accordance with the sensed light. On a light sensing face of the photodiode 13a is disposed a lens section (not illustrated) that condenses light to the light sensing face, which light enters from the outside toward the light sensing face.

Further, an operational amplifier (current (I)-voltage (V) converting circuit) 13b is provided in the light sensing section 13. The operational amplifier 13b amplifies a pulse current outputted from the photodiode 13a, converts the current into a pulse voltage, and outputs the voltage. An anode and a cathode of the photodiode 13a are connected to a non-inverting input (+) and an inverting input (−) of the operational amplifier 13b, respectively. The operational amplifier 13b may include a feedback resistor (not illustrated) of approximately 100 kΩ to 1 MΩ for returning a part of the output from the operational amplifier 13b to the inverting input.

The integrating circuit 14 integrates the pulse voltage and then outputs a result of the integration. In the integration circuit 14, a time constant at a rise of pulse is different from that at a fall of pulse. In the embodiment, rising of the pulse corresponds to a light pulse being turned on, and falling of the pulse corresponds to the light pulse being turned off. The correspondences may be the other way round.

The integrating circuit 14 is provided with: a resistor 14a connected to an output end of the operational amplifier 13b; a diode 14b connected in parallel to the resistor 14a; and a capacitor 14c connected to an output end of the resistor 14a.

The anode of the diode 14b is connected to the output end of the operational amplifier 13b, that is, an input end of the resistor 14a. On the other hand, the anode of the diode 14b is connected to the output end of the resistor 14a. One end of the capacitor 14c is connected to the output end of the resistor 14a, while the other end is connected to the ground (GND).

The voltage outputted from the integrating circuit 14 is inputted to the comparator 15. The comparator (detecting circuit) 15 compares the voltage with a reference voltage (threshold value). When the voltage is higher than the reference voltage, the comparator 15 outputs a high-level detection signal (approximately 0.5 V to 3 V). On the other hand, when the voltage is lower than the reference voltage, the comparator 15 outputs a low-level detection signal (0V). The comparator 15 may have a hysteresis characteristic with which results of comparison of the voltage with the reference voltage differ at a rise and at a fall of the voltage. Further, a constant voltage circuit 21 is provided to stabilize the voltage. The constant voltage circuit 21 is supplied with a source voltage Vcc. Further, the constant voltage circuit 21 supplies the operational amplifier 13b with a voltage for driving.

Further, the output circuit 16 serves to modify the detection signal, thereby producing an appropriate output signal. An exemplary output circuit 16 is an NPN bipolar type output transistor. The detection signal from the comparator 15 is inputted to a base of the output transistor. A collector of the output transistor is connected to the source voltage Vcc via an output resistor 25. An emitter of the output transistor is connected to the ground. Therefore, a voltage of the collector of the output transistor functions as a detection output voltage (Vo). The NPN bipolar type output transistor may instead be a PNP type transistor or a field effect transistor (FET).

The following describes operations of a photointerrupter of the present invention. In the photointerrupter, the oscillation drive circuit 11 creates a pulse signal for emitting a light pulse and drives the light emitter 12 to emit the light pulse. The photodiode 13a, which functions as the photoreceptor, senses the light pulse emitted from the light emitter 12, and converts the light pulse into a current, and outputs the current to the operational amplifier 13b. The operational amplifier 13b converts the current into a voltage, and the voltage is outputted via the integrating circuit 14 to the comparator 15. Then, the comparator 15 detects presence or absence of object in the optical path of the light pulse traveling from the light emitter 12 to the photodiode 13a.

When the pulse voltage (voltage outputted from the operational amplifier 13b), which is an output from the current(I)-voltage(V) converting circuit, rises from low level to high level (rising), the diode 14b is electrically conducted. At this time, the time constant of the integrating circuit 14 that has been converted from current into voltage is a first time constant. The first time constant is small, as it results from the diode 14b having a low resistance and the capacitor 14c. On the other hand, when the pulse voltage falls from high level to low level (falling), the diode 14b is not electrically conducted. At this time, the time constant of the integrating circuit 14 that has been converted from current into voltage is a time constant resulting from the resistor 14a and the capacitor 14c. Since the resistor 14a has a higher resistance than that of the diode 14b (electrically) conducted, this time constant is larger than the first time constant, and therefore is regarded a second time constant.

Figure 2:
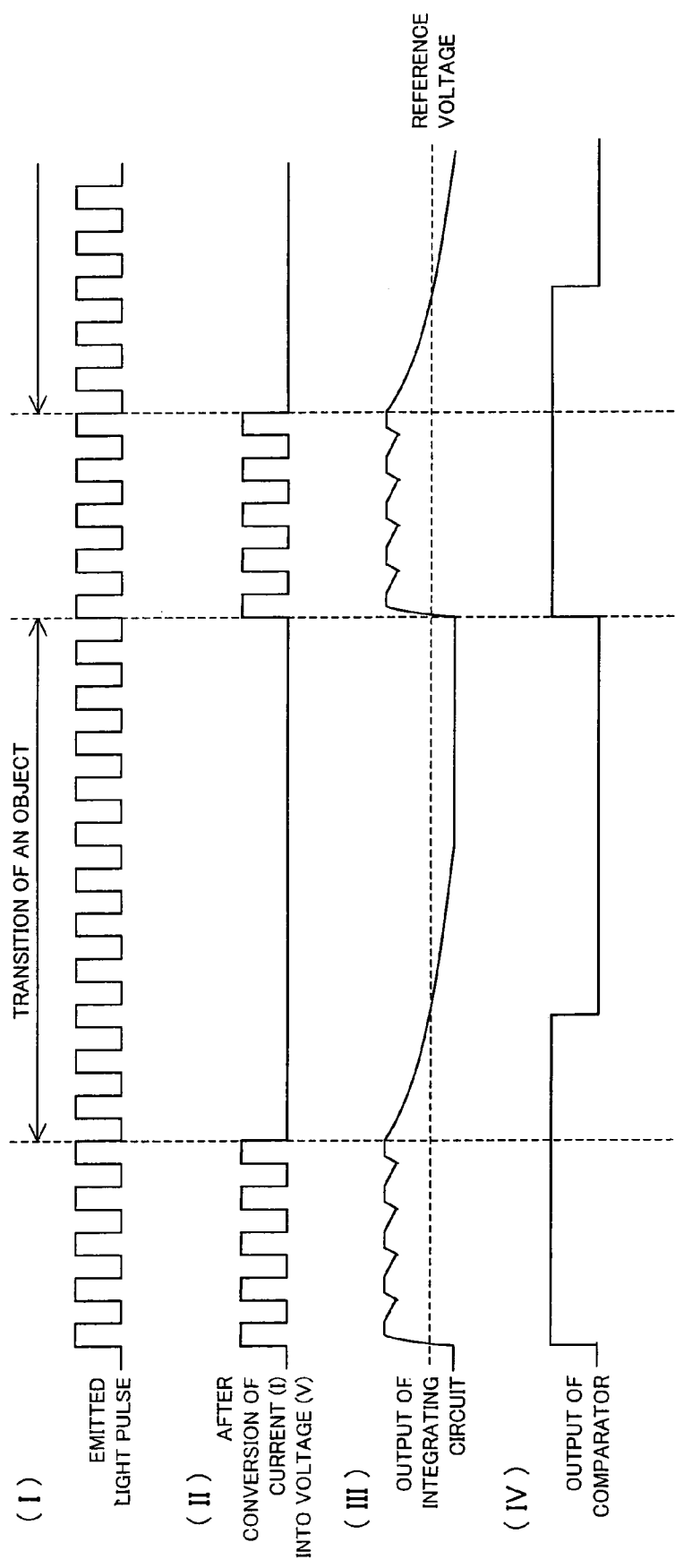
FIG. 2 illustrates waveforms for describing the operations in the photointerrupter.
Figure 3:
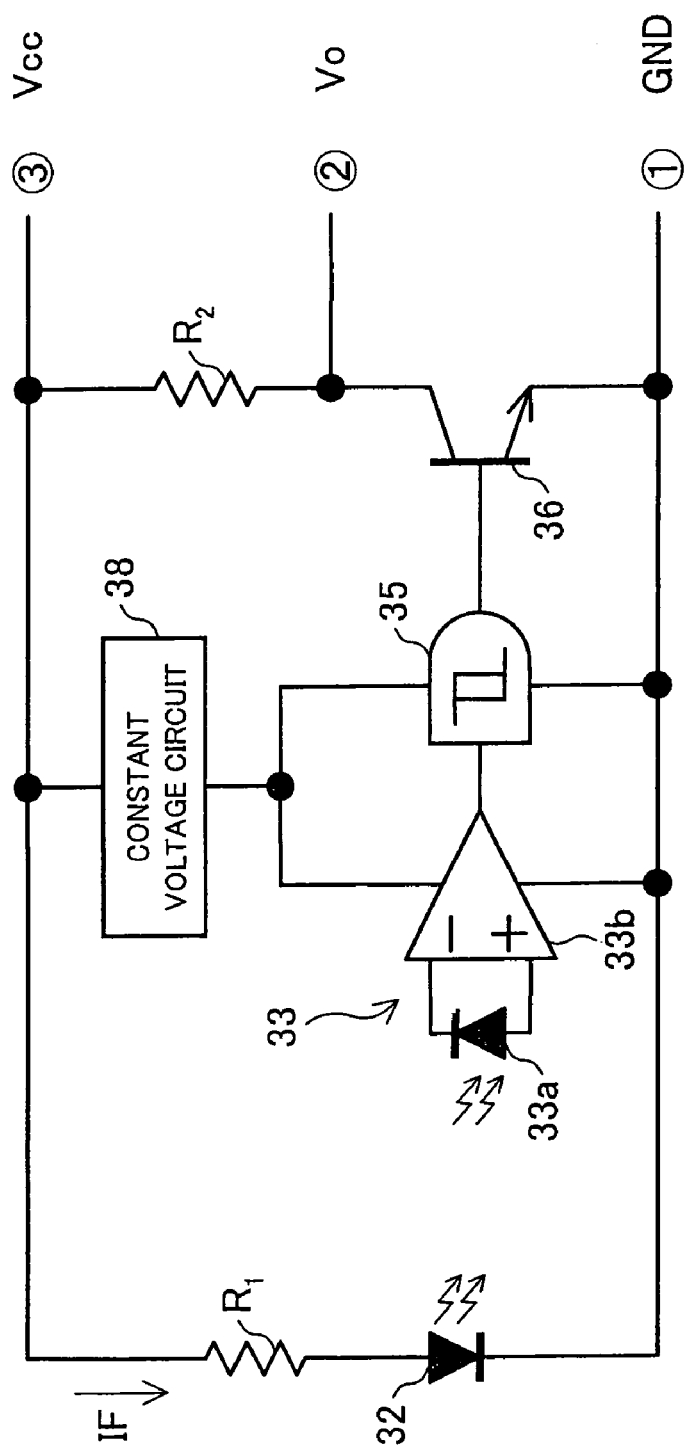
FIG. 3 is a block diagram of a first conventional photointerrupter.
Figure 4:
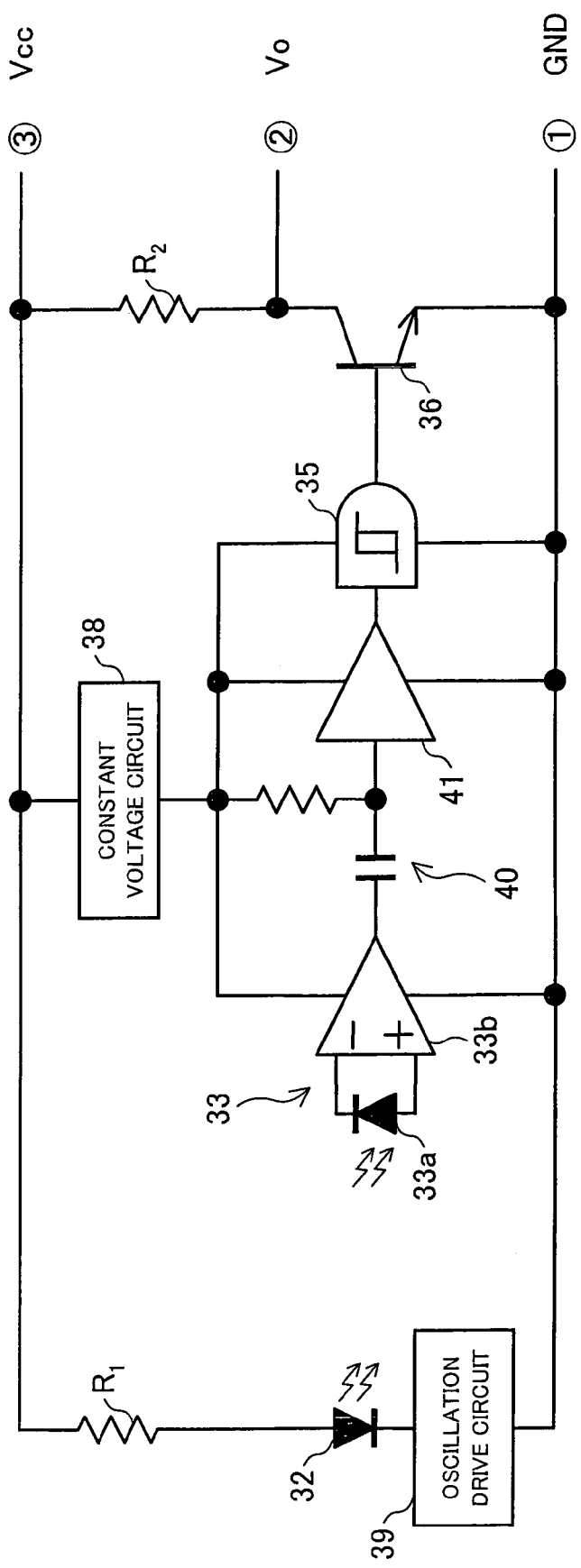
FIG. 4 is a block diagram of a second conventional photointerrupter.

As described above, in the integrating circuit 14 that integrates the pulse voltage, the first time constant at a rise of the pulse voltage is different from the second time constant at a fall thereof. Moreover, the first time constant is set smaller than the second time constant. Therefore, when an object exists in a specific area, the output of the integrating circuit 14 becomes lower level than the reference voltage. On the other hand, when no substance exits in the area, the output of the integrating circuit 14 becomes higher level than the reference voltage (FIG. 2 (III)). By comparing the output from the integrating circuit 14 with the reference voltage, the comparator 15 can detect presence/absence of the object (FIG. 2 (IV)).

At this time, by setting the first time constant, the smaller time constant of the integrating circuit 14 sufficiently smaller than the period of the light pulse that is to be emitted, and also shorter than the pulse duration of the light pulse, the delay in detecting an object at that timing can be minimized. The timing may be either the timing of the light pulse being turned off, or the timing of the light pulse being turned on. To allow a change in setting, the anode and the cathode of the diode 14b may be constituted so that their connection can be inverted.

Further, if the second time constant, the larger time constant of the integrating circuit 14, is set unnecessarily longer than the off-period of the light pulse, detection of the object at that timing is delayed. Therefore, the second time constant should be set in consideration of the delay.

As described above, in the present invention, assumed that the duty ratio of the light pulse in the light emitter 12 of the photointerrupter is 0.5, the loss in the light emitter 12 can be found by the following formula:

$$P1 = (Vcc - VF)/R \times 0.5 \times Vcc.$$

Therefore, with the foregoing duty ratio, the loss in the light emitter 12 can be significantly reduced.

Introduction of the simply structured integrating circuit 14, in which the time constant at a rise (low to high) of the light pulse is set differently from that at a fall (high to low) of the light pulse, allows simplification of the light modulation type photointerrupter, thereby reducing cost for fabricating a photointerrupter which requires less current consumption.

As described above, a photointerrupter of the present invention includes: a light source that emits a light pulse to a transit area where an object transits; a driving circuit that drives the light source to emit the light pulse; a photoreceptor that converts the light pulse from the transit area into a pulse current and outputs the pulse current; an integrating circuit that integrates a pulse signal resulting from the pulse current and outputs a result of the integration, the integrating circuit having different time constants at a rise and at a fall of the pulse signal; and a detecting circuit that detects, based upon the output from the integrating circuit, presence or absence of the object in the transit area.

Further, the light modulation type photointerrupter may further include a current-voltage converting circuit that converts a pulse current outputted from the photoreceptor into a pulse voltage and outputs the pulse voltage.

Further, in the light modulation type photointerrupter, it is preferable that a rise and a fall of the pulse signal correspond to turning on and turning off of the light pulse, respectively.

Further, in the light modulation type photointerrupter, it is preferable that a large time constant of the integrating circuit be equal to or longer than double of a pulse period of the light pulse.

Further, in the light modulation type photointerrupter, it is preferable that a small time constant of the integrating circuit be smaller than a pulse period of the light pulse.

Further, in the light modulation type photointerrupter, it is preferable that a small time constant of the integrating circuit be smaller than a pulse duration of the light pulse.

Further, in the light modulation type photointerrupter, a large time constant of the integrating circuit may be determined by a resistor and a capacitor, and a small time constant of the integrating circuit is determined by a diode and a capacitor.

Further, in the light modulation type photointerrupter, it is preferable that the diode be connected to the resistor in such a way that an anode and a cathode of the diode are connected to an input end and an output end of the resistor, respectively.

Further, in the light modulation type photointerrupter, the diode may include an anode and a cathode which are replaceable with each other.

In the above structure, by changing the direction in which the diode is connected, it is possible to reduce a detection delay of a desired timing (the timing of a light pulse being turned on or the timing of a light pulse being turned off).

Further, a light modulation type photointerrupter of the present invention may include a light source that emits a light pulse to a transit area where an object transits; a driving circuit that drives the light source to emit the light pulse; a converting unit that converts the light pulse having transited through the transit area into an electrical signal; an integrating circuit that integrates an output value of the converting unit; and a detecting circuit that compares an output value of an integrating circuit with a reference value. The integrating circuit may include: a resistor connected to the converting unit; a diode connected in parallel to the resistor and having lower resistance than a resistance of the resistor; and a capacitor connected to the resistor. In the embodiment described above, the photodiode (photoreceptor) 13a and the operational amplifier 13b form the converting unit.

Further, because a photointerrupter of the present invention consumes less current and requires less cost, the photointerrupter is suitably applicable to a field of electronics devices including FA (Factory Automation) apparatuses, such as a copying machine or a printer, OA (Office Automation) apparatuses, and amusement apparatuses for detecting, for example, coins or balls, all of which apparatuses need to detect transits of objects (recording papers, coins, and balls etc.) in a predetermined path.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A light modulation type photointerrupter comprising:
   a light source that emits a light pulse to a transit area where an object transits;
   a driving circuit that drives the light source to emit the light pulse;
   a photoreceptor that converts the light pulse from the transit area into a pulse current and outputs the pulse current;
   an integrating circuit that integrates a pulse signal resulting from the pulse current and outputs a result of the integration, the integrating circuit having a smaller time constant at a rise of the pulse signal than at a fall of the pulse signal; and a detecting circuit that detects, based upon the output from the integrating circuit, presence or absence of the object in the transit area.

2. The light modulation type photointerrupter as set forth in claim 1, further comprising a current-voltage converting circuit that converts a pulse current outputted from said photoreceptor into a pulse voltage and outputs the pulse voltage.

3. The light modulation type photointerrupter as set forth in claim 1, wherein a rise and a fall of the pulse signal correspond to turning on and turning off of the light pulse, respectively.

4. The light modulation type photointerrupter as set forth in claim 1, wherein a large time constant of said integrating circuit is equal to or longer than double of a pulse period of the light pulse.

5. The light modulation type photointerrupter as set forth in claim 1, wherein a small time constant of said integrating circuit is smaller than a pulse period of the light pulse.

6. The light modulation type photointerrupter as set forth in claim 1, wherein a small time constant of said integrating circuit is smaller than a pulse duration of the light pulse.

7. A light modulation type photointerrupter comprising:
a light source that emits a light pulse to a transit area where an object transits;
a driving circuit that drives the light source to emit the light pulse;
a photoreceptor that converts the light pulse from the transit area into a pulse current and outputs the pulse current;
an integrating circuit that integrates a pulse signal resulting from the pulse current and outputs a result of the integration, the integrating circuit having different time constants at a rise and at a fall of the pulse signal; and
a detecting circuit that detects, based upon the output from the integrating circuit, presence or absence of the object in the transit area, wherein
a large time constant of said integrating circuit is determined by a resistor and a capacitor, and a small time constant of said integrating circuit is determined by a diode and a capacitor.

8. The light modulation type photointerrupter as set forth in claim 7, wherein said diode is connected to said resistor in such a way that an anode and a cathode of said diode are connected to an input end and an output end of said resistor, respectively.

9. The light modulation type photointerrupter as set forth in claim 7, wherein said diode includes an anode and a cathode which are replaceable with each other.

10. A light modulation type photointerrupter comprising:
a light source that emits a light pulse to a transit area where an object transits;
a driving circuit that drives the light source to emit the light pulse;
a converting unit that converts the light pulse having transited through the transit area into an electrical signal;
an integrating circuit that integrates an output value of the converting unit; and
a detecting circuit that compares an output value of an integrating circuit with a reference value,
the integrating circuit comprising:
a resistor connected to the converting unit;
a diode connected in parallel to the resistor and having lower resistance than a resistance of the resistor; and
a capacitor connected to the resistor.

* * * * *